United States Patent [19]
Bright

[11] Patent Number: 6,166,675
[45] Date of Patent: Dec. 26, 2000

[54] PIPELINE ANALOG-TO-DIGITAL CONVERSION SYSTEM USING DOUBLE SAMPLING AND METHOD OF OPERATION

[75] Inventor: William J. Bright, Dallas, Tex.

[73] Assignee: Texas Instruments Incorporated, Dallas, Tex.

[21] Appl. No.: 09/146,308

[22] Filed: Sep. 3, 1998

Related U.S. Application Data

[60] Provisional application No. 60/057,443, Sep. 3, 1997.

[51] Int. Cl.⁷ ..................................................... H03M 1/12
[52] U.S. Cl. ............................................................ 341/162
[58] Field of Search ..................................... 341/161, 141

[56] References Cited

U.S. PATENT DOCUMENTS

| | | | |
|---|---|---|---|
| 5,572,212 | 11/1996 | Levinson et al. | 341/162 |
| 5,710,563 | 1/1998 | Vu et al. | 341/161 |
| 5,929,796 | 7/1999 | Opris et al. | 341/120 |
| 5,990,820 | 11/1999 | Tan | 341/161 |

FOREIGN PATENT DOCUMENTS 775007   5/1957   United Kingdom .

OTHER PUBLICATIONS

Stephen H. Lewis, et al., "A 10–b 20–Msample/s Analog–to–Digital Converter," *IEEE Journal of Solid–State Circuits*, vol. 27, No. 3, Mar., 1992, 8 pages.

Bret C. Rothenberg, et al., "A 20–Msample/s Switched–Capacitor Finite–Impulse–Response Filter Using a Transposed Structure," *IEEE Journal of Solid–State Circuits*, vol. 30, No. 12, Dec., 1995, 7 pages.

*Primary Examiner*—Brian Young
*Attorney, Agent, or Firm*—Wade James Brady, III; Frederick J. Telecky, Jr.

[57] ABSTRACT

A pipeline analog-to-digital conversion system (10) includes a plurality of cascaded subconverter stages (12) and a digital correction unit (18). Each subconverter stage (12) includes an n-bit analog-to-digital converter (36), an n-bit digital-to-analog converter (38), and an arithmetic unit (42). Arithmetic unit (42) simultaneously samples a second input analog signal (34) and produces an output analog signal (44) representative of the difference between a first input analog signal (32) and a corresponding intermediate analog signal (40).

36 Claims, 5 Drawing Sheets

PIPELINE ANALOG-TO-DIGITAL CONVERSION SYSTEM USING DOUBLE SAMPLING AND METHOD OF OPERATION

This application claims priority under 35 USC §119(e)(1) of provisional under 60/057,443 filed Sep. 3, 1997.

TECHNICAL FIELD OF THE INVENTION

This invention relates in general to signal processing, and more particularly to a pipeline analog-to-digital conversion system using double sampling and method of operation.

BACKGROUND OF THE INVENTION

Many electronic systems manipulate both digital and analog signals. To perform their intended function, these systems may convert analog signals into digital signals. For example, digital signal processing technology facilitates the economical and accurate transmission of either analog or digital signals to a remote receiver. In a particular application, signals in digital communications systems are transmitted as a sequence of binary pulses with the advantage that corruption of the amplitudes of these pulses by noise is, to a large extent, of no consequence. In contrast, digital video disk systems transmit and receive analog signals. In order to operate, however, these systems require circuitry to interface signals from the analog domain to signals in the digital domain so that they may perform further digital signal processing. Specifically, these systems require analog-to-digital conversion systems to interface the analog and digital domains. Advances in digital video disk systems and other related technologies indicate a need for increased sampling rates in analog-to-digital conversion systems.

Traditional analog-to-digital conversion systems use flash architectures or pipeline architectures to obtain 8-bit resolution at approximately the same conversion rate as each other. For more than 8-bit resolution, however, flash architectures are no longer feasible alternatives because they require large die areas and power dissipation. Pipeline conversion architectures attempt to reduce die areas and power requirements while increasing the sampling rate for resolutions greater than 8-bit. A March, 1992 article in the *IEEE Journal of Solid-State Circuits*, authored by Lewis, et al. and entitled "A 10-b 20-Msample/s Analog-to-Digital Converter," describes a particular prior art pipeline conversion system. However, these prior art systems still do not realize the optimum sampling rates attainable for a pipeline conversion system with a particular range of die areas and power dissipation.

SUMMARY OF THE INVENTION

In accordance with the teachings of the present invention, a pipeline analog-to-digital conversion system is provided which substantially increases the efficiency of prior pipeline analog-to-digital conversion systems.

In accordance with one embodiment of the present invention, an analog-to-digital conversion system includes a plurality of cascaded subconverter stages wherein each subconverter stage includes an analog-to-digital converter that converts a first input analog signal into an intermediate digital signal. A digital-to-analog converter coupled to the analog-to-digital converter converts the intermediate digital signal into an intermediate analog signal. An arithmetic circuit coupled to the digital-to-analog converter simultaneously samples a second input analog signal and produces an output analog signal representative of the difference between the first input analog signal and the corresponding intermediate analog signal.

Another embodiment of the present invention is a method for converting an analog signal into a digital signal that includes receiving a first input analog signal and converting the first input analog signal into an intermediate digital signal. The method further includes converting the intermediate digital signal into an intermediate analog signal. The method concludes by generating an output analog signal, also referred to as a "residual analog signal", at an arithmetic circuit representative of the difference between the first input analog signal and the corresponding intermediate analog signal, and, simultaneously with the step of generating, receiving a second input analog signal at the arithmetic unit.

Technical advantages of the present invention include an analog-to-digital conversion system with an increased sampling rate. For example, in one embodiment, each arithmetic circuit includes two sampling networks operating with a single amplifier. During a first phase of a clock signal, the first sampling network, decoupled from the amplifier, samples a first input analog signal to be digitized. The amplifier, coupled to the second sampling network, simultaneously generates the residual analog signal of a second input analog signal. The next stage of the pipeline analog-to-digital conversion system receives the residual analog signal for further processing.

During a second phase, the two sampling networks exchange operations so that the second sampling network, decoupled from the amplifier, samples the second input analog signal to be digitized. The amplifier, coupled to the first sampling network, simultaneously generates the residual analog signal of the first input analog signal. Again, the next stage of the pipeline analog-to-digital converter receives the residual analog signal of the first input analog signal for further processing. This operation continues until the conversion system converts each of the input analog signals into a corresponding digital output.

The technical advantage of this use of "double sampling" is that a pair of sampling networks produce a new sample of an input analog signal to be digitized during each of the two phases of a clock signal. Consequently, the amplifier generates the residual analog signal of an input analog signal during each of the two phases of a clock signal. Therefore, the sampling rate increases by a factor of two compared to the sampling rate of prior art pipeline analog-to-digital conversion architectures.

BRIEF DESCRIPTION OF THE DRAWINGS

For a more complete understanding of the present invention and its advantages, reference is now made to the following description taken in conjunction with the accompanying figures in which like reference numbers indicate like features and wherein.

DETAILED DESCRIPTION OF THE INVENTION

Figure 1:
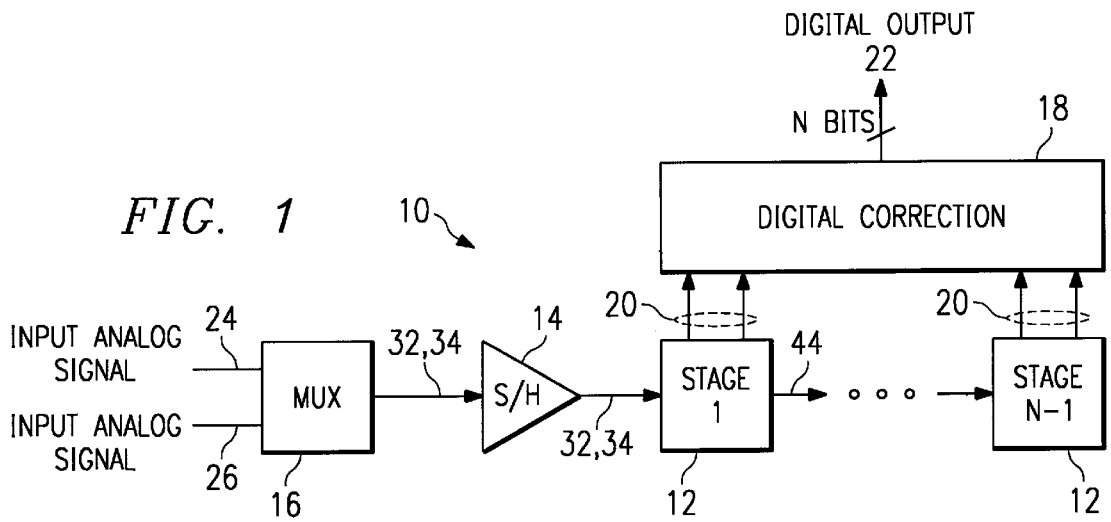
FIG. 1 illustrates one embodiment of an analog-to-digital conversion system in accordance with the teachings of the present invention.

FIG. 1 illustrates an analog-to-digital conversion system 10 that includes a plurality of cascaded subconverter stages 12, a sample and hold unit 14 coupled to the first subconverter stage 12, a multiplexer 16 coupled to sample and hold unit 14, and a digital correction unit 18 coupled to each subconverter stage 12. In general, system 10 converts each of input analog signals 32 and 34 into N bits of digital output 22. Digital output 22 may be presented in a variety of digital formats including, but not limited to, binary and hexadecimal formats.

In operation of system 10, multiplexer 16 generates a first input analog signal 32 and a second input analog signal 34 from input analog signals 24 and 26. Signals 24 and 26 may represent the same signal or two different signals. Multiplexer 16 is capable of handling both situations. If signals 24 and 26 represent the same signal, then signals 32 and 34 represent alternating segments of this single input analog signal. If signals 24 and 26 represent two different signals, then signal 32 represents successive segments of signal 24, and signal 34 represents successive segments of signal 26.

Multiplexer 16 communicates signals 32 and 34 in a serial fashion to sample and hold unit 14. Sample and hold unit 14 alternately samples each of signals 32 and 34 and communicates them to first subconverter stage 12. The remainder of the description discusses the operation of system 10 primarily in terms of input analog signal 32 and each of its corresponding digital and analog signals. However, it should be understood that system 10 operates successively and in the same manner on each of input analog signals 32 and 34.

First subconverter stage 12 resolves n bits of the final N bit conversion to produce an intermediate digital signal 20, and an output analog signal 44. In a particular embodiment, first subconverter stage 12 resolves the most significant 1.5 bits of digital output 22. Subconverter stage 12 communicates output analog signal 44 to the next subconverter stage 12 for further analog-to-digital conversion. Subconverter stage 12 performs this operation on signals 32 and 34 in succession.

Successive conversion at successive subconverter stages 12 continues until output analog signal 44 reaches last subconverter stage 12 (stage N–1). Last subconverter stage 12 resolves the final bits of the N bit conversion and communicates the resulting intermediate digital signal 20 to digital correction unit 18. Digital correction unit 18 receives intermediate digital signals 20 from each subconverter stage 12 and generates a digital output of N bits. Digital correction unit 18 is capable of generating a digital output of N bits from intermediate digital signals 20 for the case where input analog signals 24 and 26 represent the same signal, as well as the case where input analog signals 24 and 26 represent two different signals.

In previous pipeline analog-to-digital conversion architectures, the individual subconverter stages process one input analog signal at a time. In particular, each individual subconverter stage operates on a single input analog signal for an entire cycle of a clock signal. In the present invention, each subconverter stage 12 simultaneously operates on two input analog signals 32 and 34. Specifically, during a first phase of a clock signal, stage 12 performs a sampling operation on signal 32 while it performs an arithmetic operation on signal 34. During a second phase, stage 12 performs an arithmetic operation on signal 32 while it performs a sampling operation on signal 34. In this way, the present invention increases the sampling rate by a factor of two compared to the sampling rate of prior art pipeline analog-to-digital conversion architectures.

Figure 2:
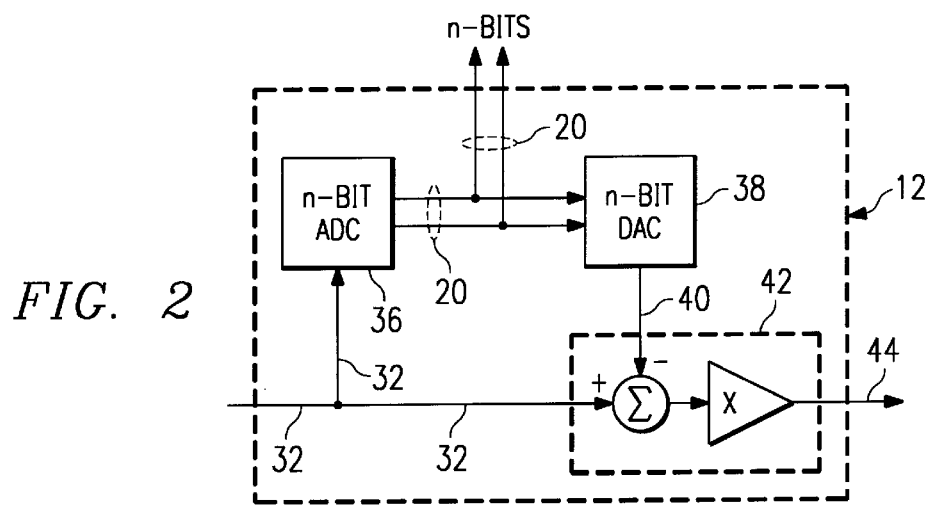
FIG. 2 illustrates one embodiment of a single stage of the analog-to-digital conversion system of FIG. 1.

FIG. 2 illustrates one embodiment of a single subconverter stage 12 of analog-to-digital conversion system 10 of FIG. 1. Stage 12 includes an n-bit analog-to-digital converter 36 ("n-bit ADC"), an n-bit digital-to-analog converter 38 ("n-bit DAC") coupled to converter 36, and an arithmetic circuit 42 coupled to converter 38. The n-bit ADC 36 receives signals 32 and 34 as successive output analog signals 44 from the previous stage 12, unless stage 12 is the first stage of cascaded subconverter stages 12.

In operation, n-bit ADC 36 resolves n bits of the final N bit conversion, and produces a corresponding intermediate digital signal 20 for communication to digital correction unit 18 and n-bit DAC 38. The n-bit DAC 38 converts signal 20 into a corresponding intermediate analog signal 40. Arithmetic circuit 42 receives signal 32 and its corresponding signal 40 from n-bit DAC 38.

Arithmetic circuit 42 amplifies the difference between input analog signal 32 and signal 40 to produce a corresponding output analog signal 44. Throughout this description the term "residual analog signal" is also used to refer generally to signal 44. The next stage 12 receives residual analog signal 44 as the corresponding input analog signal 32. This operation repeats for N–1 stages until the original input analog signal 32 is converted into a corresponding digital output 22 of N bits.

Unlike in previous pipeline analog-to-digital conversion architectures, in the present invention, arithmetic circuit 42 operates on two input analog signals 32 and 34 simultaneously. Specifically, during a first phase of a clock signal, arithmetic circuit 42 performs a sampling operation on signal 32 while it amplifies the difference between input analog signal 34 and its corresponding intermediate analog signal 40 to produce a corresponding output analog signal 44. During a second phase, arithmetic circuit 42 performs a sampling operation on signal 34 while it amplifies the difference between input analog signal 32 and its corresponding intermediate analog signal 40 to produce a corresponding output analog signal 44. In the present invention, both n-bit ADC 36 and n-bit DAC 38 operate on signal 32 during the second phase of the clock signal and operate on signal 34 during the first phase of the clock signal.

Figure 3:
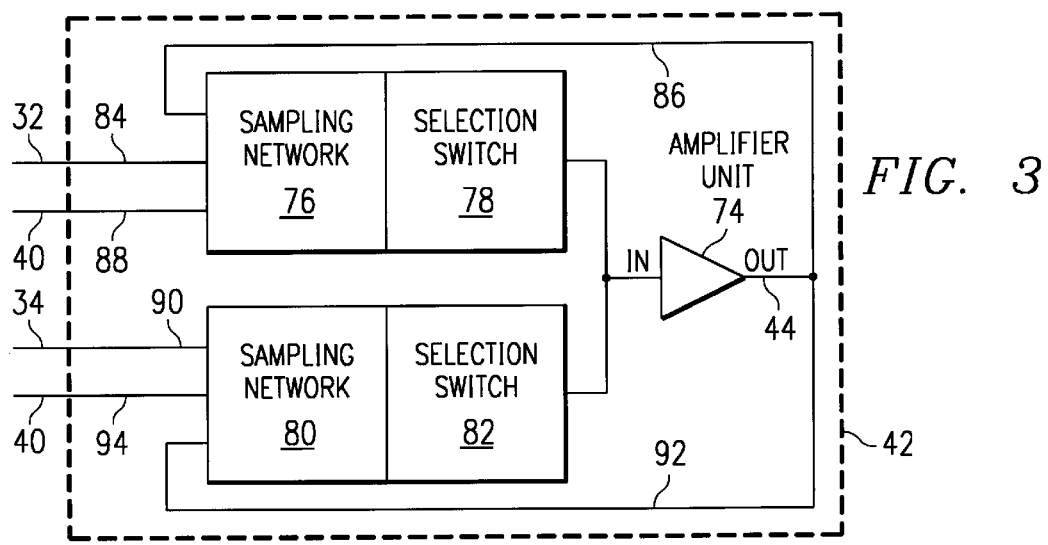
FIG. 3 is a block diagram of one embodiment of an arithmetic circuit associated with a single stage of the analog-to-digital conversion system of FIG. 1.

FIG. 3 is a block diagram of one embodiment of arithmetic circuit 42 associated with subconverter stage 12 of analog-to-digital conversion system 10 of FIG. 1. Arithmetic circuit 42 includes an amplifier 74 which may have one or more input terminals IN and one or more output terminals OUT depending on the particular differential, non-differential, or other suitable implementation. Arithmetic circuit 42 also includes a first sampling network 76 having a selection switch 78, and a second sampling network 80 having a selection switch 82. Selection switches 78 and 82 alternately couple their associated sampling networks 76 and 80, respectively, to amplifier 74.

In one embodiment of the present invention, a high first clock phase corresponds to a low second clock phase and a high second clock phase corresponds to a low first clock phase. During a high first clock phase, network 76, decoupled from amplifier 74 by switch 78, samples signal 32 at a first terminal 84. At the moment of transition from a low first clock phase to the high first clock phase, network 80 has charged to an appropriate voltage associated with signal 34 during its sampling operation. During the high first clock phase, switch 82 couples network 80 to amplifier 74, terminal 92 couples to the output associated with amplifier 74, and terminal 94 couples to signal 40. Furthermore, amplifier 74 amplifies the difference between input analog signal 34 and signal 40 to produce a corresponding residual analog signal 44. The next stage 12 receives signal 44 as input analog signal 34.

During a high second clock phase, network 80, decoupled from amplifier 74 by switch 82, samples the next signal 34 at a first terminal 90. At the moment of transition from a low second clock phase to the high second clock phase, network 76 has charged to an appropriate voltage associated with signal 32 during its sampling operation. During the high second clock phase, switch 78 couples network 76 to amplifier 74, terminal 86 couples to the output associated with amplifier 74, and terminal 88 couples to signal 40. Furthermore, amplifier 74 amplifies the difference between input analog signal 32 and signal 40 to produce a corresponding residual analog signal 44. The next stage 12 receives signal 44 as input analog signal 32. In this manner, amplifier 74 simultaneously serves both sampling networks 76 and 80 to improve the sampling rate by a factor of two over prior art analog-to-digital conversion architectures.

Figure 4:
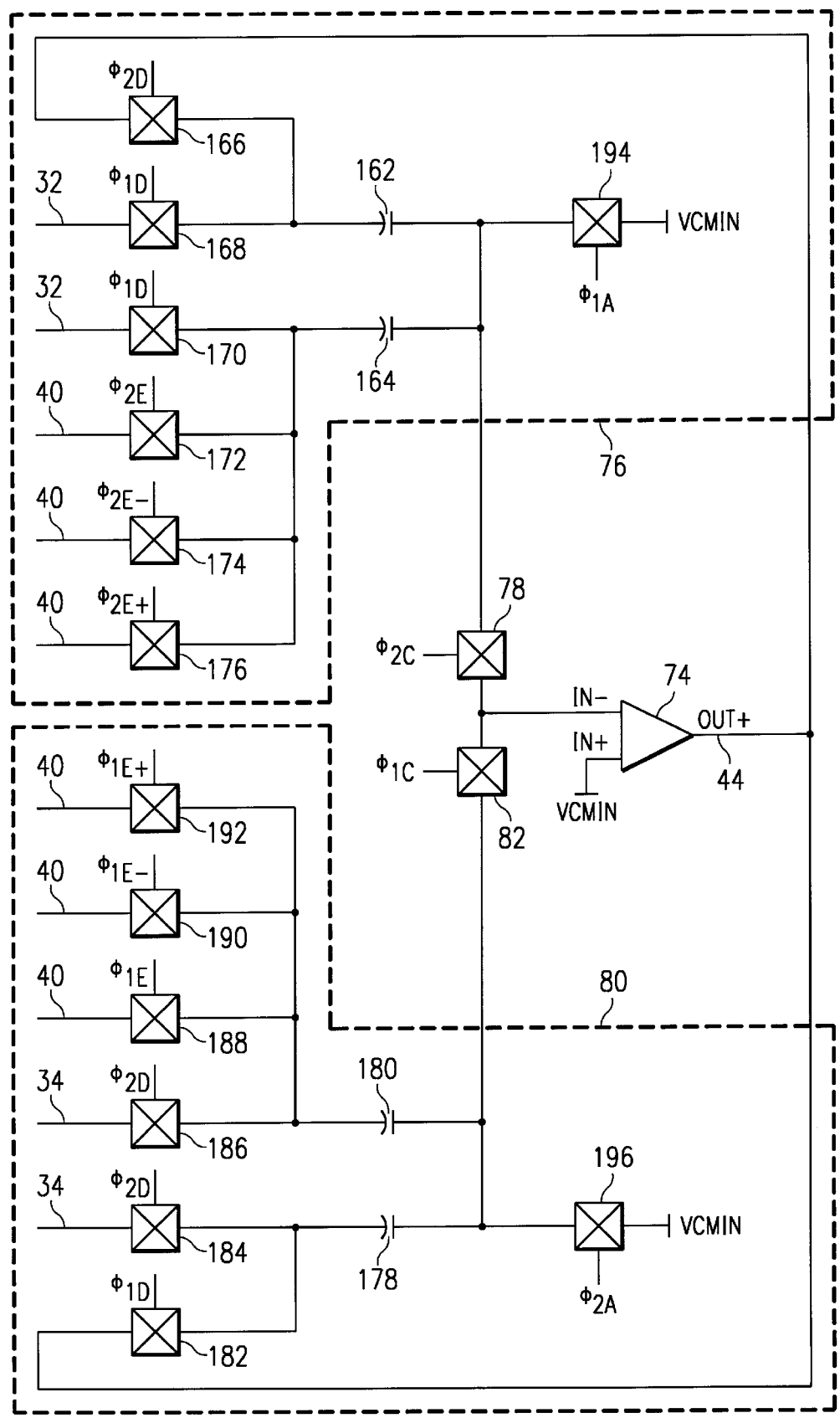
FIG. 4 illustrates a non-differential embodiment of an arithmetic circuit associated with a single stage of the analog-to-digital conversion system of FIG. 1.

Arithmetic circuit 42 may be implemented in a non-differential embodiment or in a differential embodiment. FIG. 4 illustrates a non-differential embodiment of arithmetic circuit 42 that includes sampling networks 76 and 80, switches 78 and 82, and amplifier 74 having an inverting input terminal IN−, a non-inverting input terminal IN+, and a non-inverting output terminal OUT+. A common mode voltage (VCMIN) is coupled to IN+. Switch 78 couples and decouples network 76 and amplifier 74. In particular, switch 78 couples a first terminal of feedback capacitor 162 and a first terminal of source capacitor 164 to IN−. A feedback switch 166 couples a second terminal of capacitor 162 to signal 44. Input switches 168 and 170 couple the second terminals of capacitors 162 and 164, respectively, to signal 32. A selection of source switches 172, 174, and 176, chosen according to the intermediate digital signal 20 associated with signal 32, couple signal 40 to the second terminal of capacitor 164. A common mode switch 194 couples the first terminals of capacitors 162 and 164 to VCMIN.

Switch 82 couples and decouples network 80 and amplifier 74. In particular, switch 82 couples a first terminal of feedback capacitor 178 and a first terminal of source capacitor 180 to IN−. A feedback switch 182 couples a second terminal of capacitor 178 to signal 44. Input switches 184 and 186 couple the second terminals of capacitors 178 and 180, respectively, to signal 34. A selection of source switches 188, 190, and 192, chosen according to the intermediate digital signal 20 associated with signal 34, couple signal 40 to the second terminal of capacitor 180. A common mode switch 196 couples the first terminals of capacitors 178 and 180 to VCMIN. The first phase clocking signals ($\phi_{1A}$, $\phi_{1C}$, $\phi_{1D}$, $\phi_{1E}$, $\phi_{1E-}$, $\phi_{1E+}$) and the second phase clocking signals ($\phi_{2A}$, $\phi_{2C}$, $\phi_{2D}$, $\phi_{2E}$, $\phi_{2E-}$, $\phi_{2E+}$) control the operation of the switches in FIG. 4, as described below in more detail with reference to FIG. 8.

Figure 5:
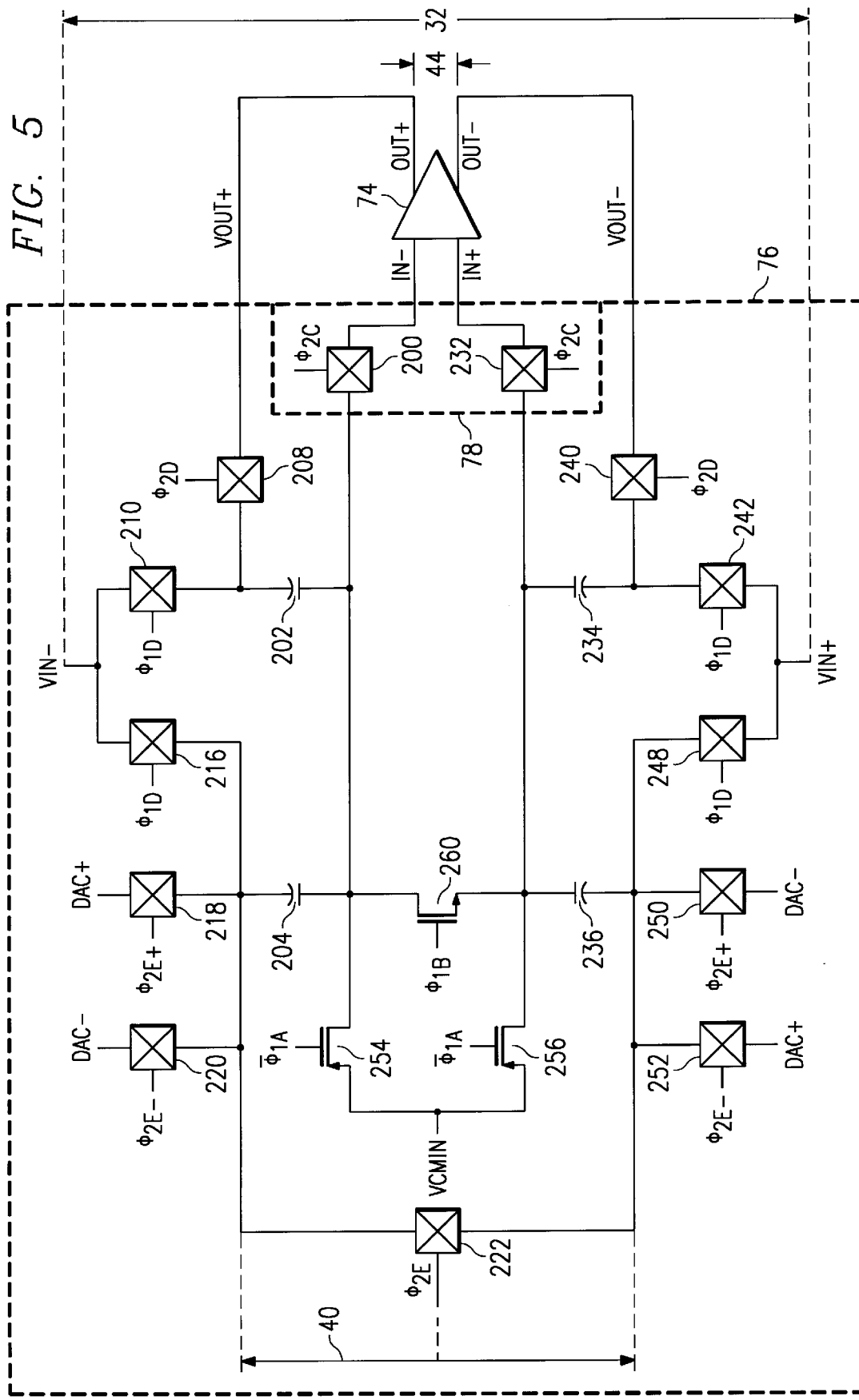
FIG. 5 illustrates, in more detail, a portion of a differential embodiment of the arithmetic circuit of FIG. 3 that includes a first sampling network.

FIG. 5 illustrates, in more detail, a portion of a differential embodiment of arithmetic circuit 42 of FIG. 3 that includes sampling network 76, switch 78, and amplifier 74. In this embodiment, amplifier 74 includes differential inputs IN− and IN+ and differential outputs OUT− and OUT+. Signal 32 comprises input analog voltages VIN− and VIN+ forming a corresponding differential input analog voltage VIN. Each corresponding output analog signal 44 comprises the output analog voltages VOUT− and VOUT+ forming a corresponding differential output analog voltage VOUT. Each corresponding intermediate analog signal 40 comprises a zero voltage or the intermediate analog voltages DAC− and DAC+ forming a differential intermediate analog voltage VDAC.

Switch 78 comprises switches 200 and 232 which couple and decouple network 76 with amplifier 74. Switch 200 couples a first terminal of a feedback capacitor 202 and a first terminal of a source capacitor 204 to an inverting input terminal IN− associated with amplifier 74. A feedback switch 208 and an input switch 210 couple VOUT+ and VIN−, respectively, to a second terminal of capacitor 202. An input switch 216 couples VIN− to a second terminal of 204.

Switch 232 couples a first terminal of a feedback capacitor 234 and a first terminal of a source capacitor 236 to a non-inverting input terminal IN+ associated with amplifier 74. A feedback switch 240 and an input switch 242 couple VOUT− and VIN+, respectively, to a second terminal of capacitor 234. An input switch 248 couples VIN+ to a second terminal of capacitor 236.

A common mode switch 254 couples a common mode voltage (VCMIN) to the first terminals of capacitors 204 and 202. A common mode switch 256 couples VCMIN to the first terminals of capacitors 236 and 234. The value of VCMIN is chosen to appropriately bias the differential operation of amplifier 74. A center switch 260 couples the first terminals of capacitors 204 and 202 to the first terminals of capacitors 236 and 234.

In one embodiment, switches 254 and 256 are PMOS transistors while center switch 260 is an NMOS transistor. This particular three switch configuration prevents the accumulation of any residual or spurious charge on capacitors 202, 204, 234, and 236. In effect, this configuration reduces offset in the overall transfer function of the analog-to-digital conversion system.

A selection of source switches 218, 220, 222, 250 and 252, chosen according to the intermediate digital signal 20, couple one of three intermediate analog voltages, DAC−, DAC+, or zero to each of the second terminals of capacitors 204 and 236. The digital code of signal 20 is dependent upon the value of VIN. In one embodiment of the present invention, VIN represents a differential input analog voltage ranging from −VREF to +VREF. The analog-to-digital converter 36 resolves the most significant 1.5 bits of digital output 22 associated with VIN resulting in intermediate digital signals 20 equal to "00", "01", or "10" depending upon the value of VIN. This conversion process effectively assigns one of these three values to signal 20 based upon the value of VIN in comparison with three threshold ranges associated with VREF. For example:

(1) if VIN ranges from −VREF to −(¼)VREF then signal 20 equals "00";

(2) if VIN ranges from −(¼)VREF to +(¼)VREF then signal 20 equals "01"; and (3) if VIN ranges from +(¼)VREF to +VREF then signal 20 equals "10".

As discussed above, a selection of switches 218, 220, 222, 250, and 252 are closed according to the value of signal 20 to form signal 40. For example, in one embodiment of the present invention, if signal 20 is "00", then switch 218 couples the second terminal of capacitor 204 to DAC+, where DAC+=+(½)VREF, and switch 250 couples the second terminal of capacitor 236 to DAC−, where DAC−=−(½)VREF. This effectively adds a differential reference voltage VREF to twice the differential input analog voltage VIN, where VDAC=+(½) VREF. If signal 20 is "01", then switch 222 couples the second terminal of capacitor 204 to the second terminal of capacitor 236, effectively shorting the two capacitors together and adding zero to twice the differential input analog voltage VIN. If signal 20 is "10", then switch 220 couples the second terminal of capacitor 204 to DAC−, where DAC−=−(½)VREF, and switch 252 couples the second terminal of capacitor 236 to DAC+, where DAC+=+(½)VREF. This effectively subtracts a differential reference voltage VREF from twice the differential input analog voltage VIN, where VDAC=+(½)VREF.

Figure 8:
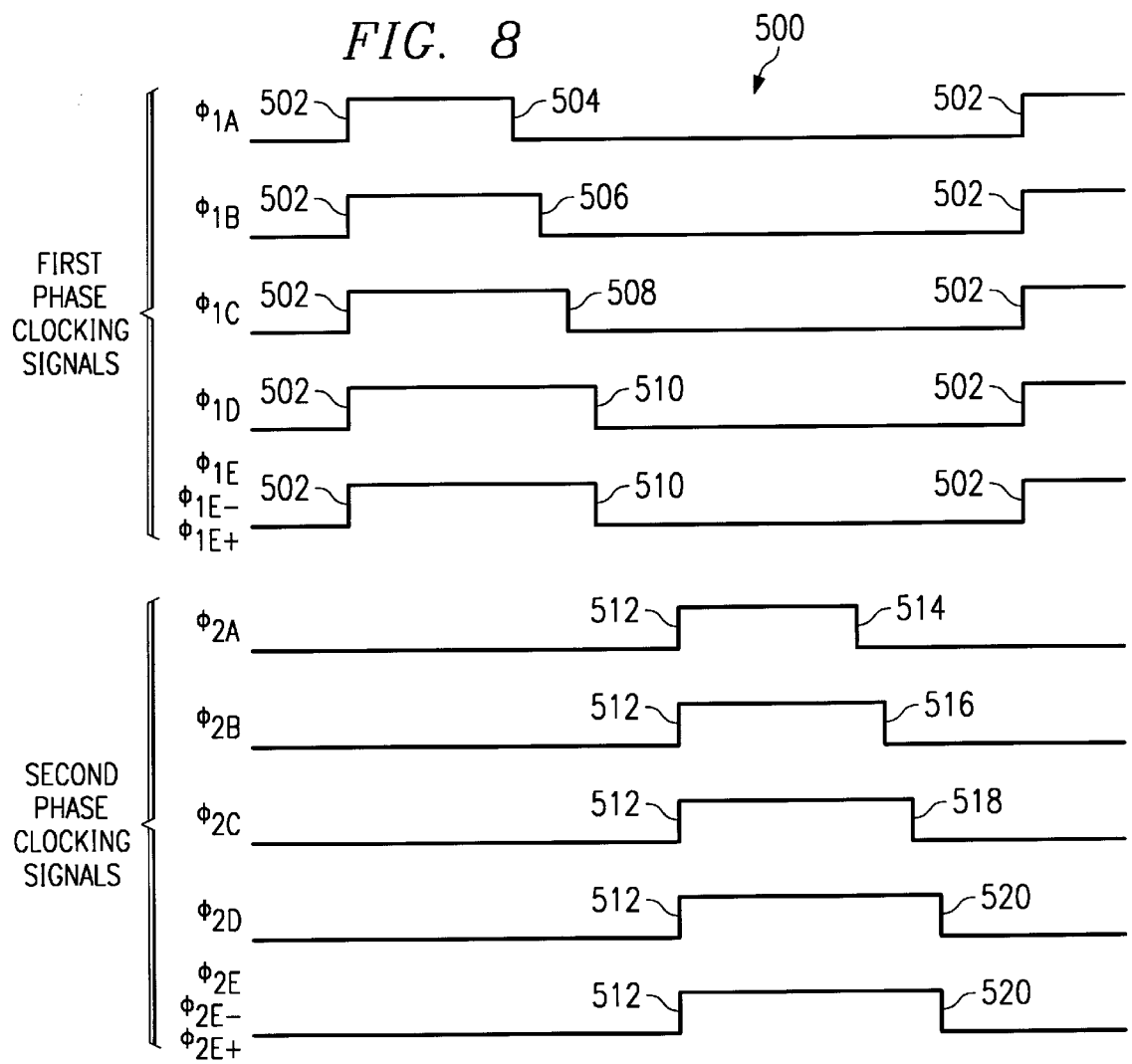
FIG. 8 illustrates a timing diagram for the operation of the arithmetic circuits of FIGS. 4, 5, and 6 in accordance with the teachings of the present invention.

The first phase clocking signals ($\phi_{1A}$, $\phi_{1B}$, $\phi_{1C}$, $\phi_{1D}$, $\phi_{1E}$, $\phi_{1E-}$, $\phi_{1E+}$) and the second phase clocking signals ($\phi_{2A}$, $\phi_{2B}$, $\phi_{2C}$, $\phi_{2D}$, $\phi_{2E}$, $\phi_{2E-}$, $\phi_{2E+}$) control the operation of the previously discussed switches as depicted in FIG. 5, and as discussed in relation to FIG. 8. Furthermore, in network 76, the voltages VIN−, VIN+, VIN, VOUT−, VOUT+, VOUT, VDAC, VREF, and intermediate analog signal 20 are all associated with input analog signal 32.

The sizing of capacitors 202, 204, 234, and 236 depend on several factors. A larger capacitance reduces the noise (KT/C) attributable to switched operation in relation to the desired resolution of the system, but also increases system response time and systematic errors due to deposition inconsistencies. In a particular embodiment, capacitors 202, 204, 234, and 236 are each approximately 100 fF in the first subconverter stage 12, and approximately 50 fF in the other subconverter stages 12. The characteristics of amplifier 74 depend on chosen capacitances and other factors, and in a particular embodiment, amplifier 74 has a gain of approximately 70dB and a unit of gain bandwidth of approximately 800MHz open loop and approximately 200MHz closed loop. Switch sizes in sampling network 78 are chosen to ensure that their combined series resistance results in a time constant consistent with the desired sampling bandwidth of analog-to-digital conversion system 10.

Figure 6:
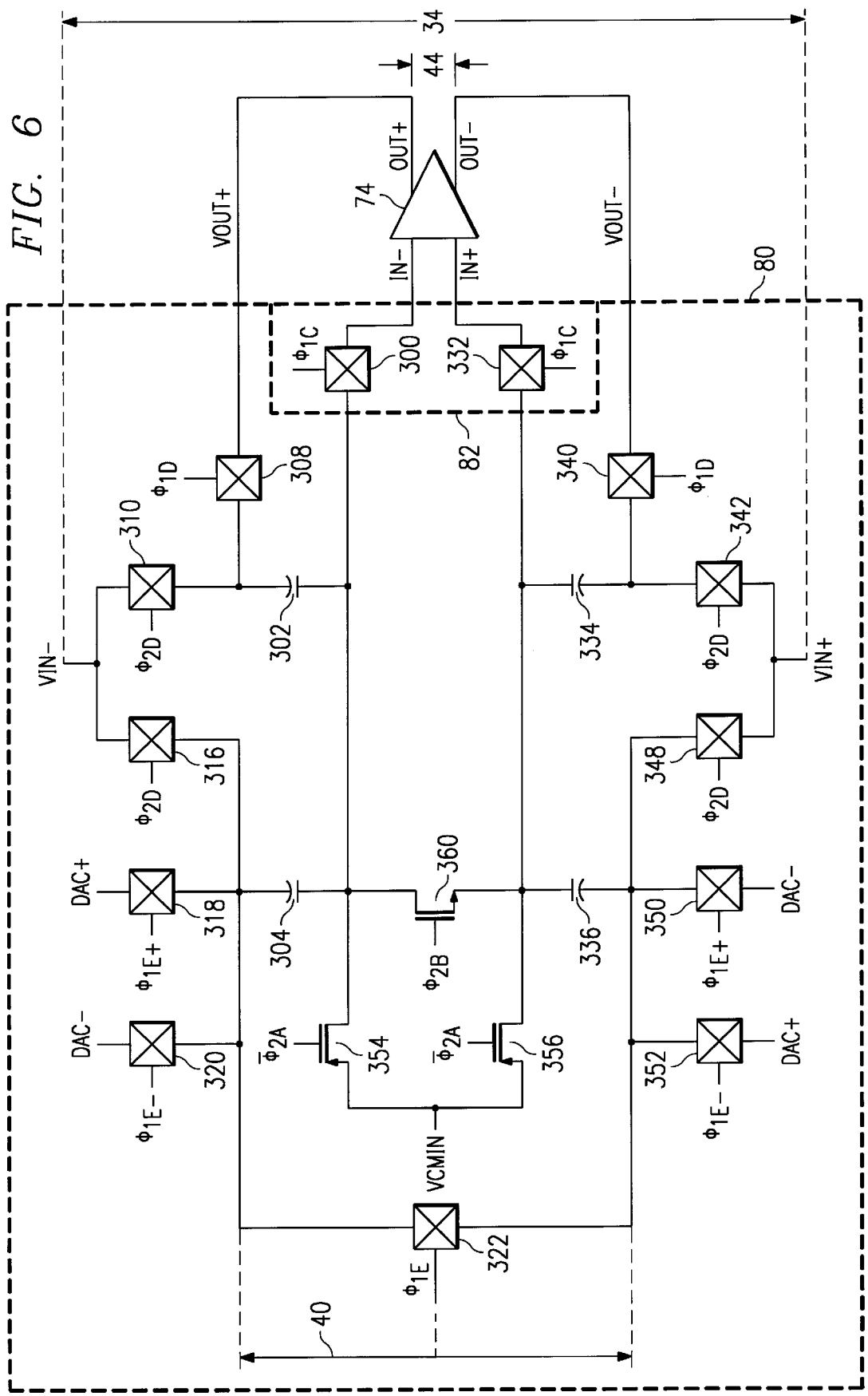
FIG. 6 illustrates, in more detail, a portion of a differential embodiment of the arithmetic circuit of FIG. 3 that includes a second sampling network.

FIG. 6 illustrates, in more detail, a portion of a differential embodiment of arithmetic circuit 42 that includes sampling network 80, switch 82, and amplifier 74. The circuit elements of network 80 are substantially similar or identical to those of network 76. However, the clocking signals for network 80 bear an inverse relationship with the clocking signals for network 76. In particular, if a first phase clocking signal controls the operation of a specific switch in network 76, then a corresponding second phase clocking signal controls the operation of the corresponding switch in network 80. Conversely, if a second phase clocking signal controls the operation of a specific switch in network 76, then a corresponding first phase clocking signal controls the operation of the corresponding switch in network 80. Furthermore, in network 80, the voltages VIN−, VIN+, VIN, VOUT−, VOUT+, VOUT, VDAC, VREF, and intermediate analog signal 20 are all associated with input analog signal 34.

The difference between networks 76 and 80 lies in their cooperative operation in arithmetic circuit 42. Specifically, networks 76 and 80, by their inverse switch arrangement, alternate the operations of sampling and amplifying signals 32 and 34 on successive phases of a clocking signal to provide a double sampling capability.

Figure 7:
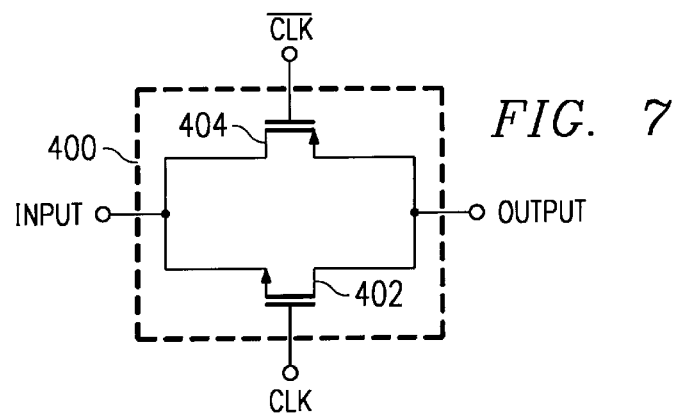
FIG. 7 illustrates, in more detail, the switching mechanism employed by the arithmetic circuit of FIGS. 4, 5, and 6.

FIG. 7 illustrates, in more detail, the switching mechanism employed by arithmetic circuit 42 of FIGS. 4, 5, and 6. In particular, the select switches, feedback switches, input switches, and source switches of arithmetic circuit 42, as well as the common mode switches of FIG. 4 may use the switching mechanism of switch 400. In one embodiment, switch 400 is a CMOS transistor implementation which includes an NMOS transistor 402 having a source terminal coupled to an input, a gate terminal coupled to a first clock signal (CLK), and a drain terminal coupled to an output. The CMOS transistor implementation of switch 400 further includes a PMOS transistor 404 having a source terminal coupled to the output, a gate terminal coupled to a second clock signal ($\overline{CLK}$) which bears an inverse relationship with the first clock signal, and a drain terminal coupled to the input. This arrangement of transistors 402 and 404 allows switch 400 to pass a signal from its input to its output in response to clocking or selection signals while reducing or eliminating residual or spurious signals associated with the operation of transistors 402 and 404.

FIG. 8 illustrates a timing diagram 500 that controls the operation of arithmetic circuit 42. In particular, first phase clocking signals comprise common mode switch signal $\phi_{1A}$, a center switch signal $\phi_{1B}$, a select switch signal $\phi1_C$ a feedback switch signal $\phi_{1D}$, and a plurality of source switch signals $\phi_{1E}$, $\phi_{1E-}$, and $\phi_{1E+}$. Second phase clocking signals comprise a common mode switch signal $\phi_{2A}$, a center switch signal $\phi_{2B}$, a select switch signal $\phi_{2C}$, a feedback switch signal $\phi_{2D}$, and a plurality of source switch signals $\phi_{2E}$, $\phi_{2E-}$, and $\phi_{2E+}$. The following description of timing diagram 500 characterizes the operation of the differential embodiment of arithmetic circuit 42 illustrated in FIGS. 5 and 6, but applies equally to the non-differential embodiment of arithmetic circuit 42 illustrated in FIG. 4.

Upon the rising edge 502 of $\phi_{1A}$, $\phi_{1B}$, $\phi_{1C}$, $\phi_{1D}$, $\phi_{1E}$, $\phi_{1E-}$, and $\phi_{1E+}$, switch 78 decouples network 76 from amplifier 74 and switch 82 couples network 80 to amplifier 74. At this time, network 76 performs a sampling operation upon signal 32 while network 80 simultaneously performs an amplification operation upon signal 34.

Now referring to network 76 and switch 78 of FIG. 5, upon rising edge 502, switches 200 and 232 of switch 78 remain open, decoupling network 76 from amplifier 74. Common mode switches 254 and 256, center switch 260, and input switches 210, 216, 242, and 248 are closed. In this configuration, capacitors 204 and 202 receive VIN− associated with signal 32 at their second terminals and VCMIN at their first terminals. Simultaneously, capacitors 236 and 234 receive VIN+ associated with signal 32 at their second terminals and VCMIN at their first terminals.

Now referring to network 80 and switch 82 of FIG. 6, upon rising edge 502, select switches 300 and 332 of switch 82 are closed to couple the first terminals of capacitors 302, 304, 334, and 336 of network 80 to amplifier 74. In a previous sampling operation, capacitors 302, 304, 334 and 336 have already been charged by differential voltage VIN associated with signal 34. Feedback switches 308 and 340 are closed, coupling the second terminals of capacitors 302 and 304 to VOUT+ and VOUT− associated with signal 34, respectively. A selection of source switches 318, 320, 322, 350, and 352, chosen according to the corresponding signal 20 produced by n-bit ADC 36 for each particular stage, are closed, coupling the second terminals of capacitors 304 and 336 to signal 40. Amplifier 74 then produces signal 44 in response to capacitors 302 and 334 charged by signal 34 and capacitors 304 and 336 charged by signals 34 and 40. Specifically, signal 44 includes a charge transfer component resulting from a charge transfer between source capacitors 304 and 336 and feedback capacitors 302 and 334. The voltage VOUT− associated with signal 34 is the corresponding voltage VIN+ of the next stage 12. The voltage VOUT+ associated with signal 34 is the corresponding voltage VIN− of the next stage 12.

In one embodiment of the present invention, the falling edges 504, 506, 508, and 510 of $\phi_{1A}$, $\phi_{1B}$, $\phi_{1C}$, $\phi_{1D}$, $\phi_{1E}$, $\phi_{1E-}$, and $\phi_{1E+}$ are delayed so that each successive falling edge occurs after the previous falling edge. In one embodiment, each successive edge is delayed by one nanosecond. In particular, the $\phi_{1A}$ falling edge 504 occurs first, followed by the $\phi_{1B}$ falling edge 506 so that any distortion to the charges stored by capacitors 202, 204, 234, and 236 caused by the opening of common mode switches 254 and 256 may equilibrate prior to the opening of center switch 260, which defines the end of the sampling operation associated with signal 32. This sequencing allows amplifier 74 to perform an accurate differential operation. The sequence of opening common mode switches 254 and 256 and center switch 260 prior to the opening of any other switches facilitates the accurate sampling of signal 32 on capacitors 202, 204, 234, and 236 without the buildup of spurious charges.

Next, the $\phi_{1C}$ falling edge 508 occurs, followed by the $\phi_{1D}$ falling edge 510 and the $\phi_{1E}$, $\phi_{1E-}$, and $\phi_{1E+}$ falling edge 510. This sequence of opening select switches 300 and 332 prior to the opening of input switches (210, 216, 242, 248), feedback switches (308, 340) and source switches (318, 320, 322, 350, 352), decouples capacitors 302, 304, 334, and 336 from input terminals IN− and IN+ of amplifier 74 without the buildup of spurious voltages at IN− and IN+.

Upon the rising edge 512 of $\phi_{2A}$, $\phi_{2B}$, $\phi_{2C}$, $\phi_{2D}$, $\phi_{2E}$, $\phi_{2E-}$, and $\phi_{2E+}$ switch 82 decouples network 80 from amplifier 74 and switch 78 couples network 76 to amplifier 74. At this time, network 80 performs a sampling operation upon signal 34 while network 78 simultaneously performs an amplification operation upon signal 32.

Now referring to network 80 and switch 82 of FIG. 6, upon rising edge 512, switches 300 and 332 of switch 82 remain open, decoupling network 80 from amplifier 74. Common mode switches 354 and 356, center switch 360, and input switches 310, 316, 342, and 348 are closed. In this configuration, capacitors 304 and 302 receive VIN− associated with signal 34 at their second terminals and VCMIN at their first terminals. Simultaneously, capacitors 336 and 334 receive VIN+ associated with signal 34 at their second terminals and VCMIN at their first terminals.

Now referring to network 76 and switch 78 of FIG. 5, upon rising edge 512, select switches 200 and 232 of switch 78 are closed to couple the first terminals of capacitors 202, 204, 234, and 236 of network 76 to amplifier 74. In a previous sampling operation, capacitors 202, 204, 234 and 236 have already been charged by differential voltage VIN associated with signal 32. Feedback switches 208 and 240 are closed, coupling the second terminals of capacitors 202 and 204 to VOUT+ and VOUT− associated with signal 32, respectively. A selection of source switches 218, 220, 222, 250, and 252, chosen according to the corresponding signal 20 produced by n-bit ADC 36, are closed, coupling the second terminals of capacitors 204 and 236 to signal 40. Amplifier 74 then produces signal 44 in response to capacitors 202 and 234 charged by signal 32 and capacitors 204 and 236 charged by signals 32 and 40. Specifically, signal 44 includes a charge transfer component resulting from a charge transfer between source capacitors 204 and 236 and feedback capacitors 202 and 234. The voltage VOUT− associated with signal 32 is the corresponding voltage VIN+ of the next stage 12. The voltage VOUT+ associated with signal 32 is the corresponding voltage VIN− of the next stage 12.

In one embodiment of the present invention, the falling edges 514, 516, 518, and 520 of $\phi_{2A}$, $\phi_{2B}$, $\phi_{2C}$, $\phi_{2D}$, $\phi_{2E}$, $\phi\phi_{2E-}$, and $\phi_{2E+}$ are delayed so that each successive falling edge occurs after the previous falling edge. In one embodiment, each successive edge occurs one nanosecond after the previous falling edge. In particular, the $\phi_{2A}$ falling edge 514 occurs first, followed by the $\phi_{2B}$ falling edge 516 so that any distortion to the charges stored by capacitors 302, 304, 334, and 336 caused by the opening of common mode switches 354 and 356 may equilibrate prior to the opening of center switch 360, which defines the end of the sampling operation associated with the input analog signal 34. This sequencing allows amplifier 74 to perform an accurate differential operation. The sequence of opening common mode switches 354 and 356 and center switch 360 prior to the opening of any other switches facilitates the accurate sampling of signal 34 on capacitors 302, 304, 334, and 336 without the buildup of spurious charges.

Next, the $\phi_{2C}$ falling edge 518 occurs, followed by the $\phi_{2D}$ falling edge 520 and the $\phi_{2E}$, $\phi_{2E-}$, and $\phi\phi_{2E+}$ falling edge 520. This sequence of opening select switches 200 and 232 prior to the opening of input switches (310, 316, 342, 348), feedback switches (208, 240), and source switches (218, 220, 222, 250, 252), decouples capacitors 202, 204, 234, and 236 from input terminals IN− and IN+ of amplifier 74 without the buildup of spurious voltages at IN− and IN+. The process repeats for the next rising edge 502 of first phase clocking signals.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. An analog-to-digital conversion system comprising a plurality of cascaded subconverter stages wherein each subconverter stage comprises:

an analog-to-digital converter operable to convert a first input analog signal into an intermediate digital signal;

a digital-to-analog converter coupled to the analog-to-digital converter and operable to convert the intermediate digital signal into an intermediate analog signal; and an arithmetic unit coupled to the digital-to-analog converter and operable simultaneously to sample a second input analog signal and to produce an output analog signal representative of the difference between the first input analog signal and the corresponding intermediate analog signal.

2. The system of claim 1, further comprising a sample and hold unit operable to sample and communicate the first input analog signal and the second input analog signal to a first subconverter stage.

3. The system of claim 1, further comprising a digital correction unit coupled to the analog-to-digital converter of each subconverter stage and operable to generate a digital output using the intermediate digital signal from each subconverter stage.

4. The system of claim 1, further comprising a multiplexer operable to generate the first input analog signal and the second input analog signal from a single input analog signal.

5. An analog-to-digital conversion system comprising a plurality of cascaded subconverter stages wherein each subconverter stage comprises:
- an analog-to-digital converter operable to convert a first input analog signal into an intermediate digital signal;
- a digital-to-analog converter coupled to the analog-to-digital converter and operable to convert the intermediate digital signal into an intermediate analog signal; and
- an arithmetic unit coupled to the digital-to-analog converter and operable simultaneously to sample a second input analog signal and to produce an output analog signal representative of the difference between the first input analog signal and the corresponding intermediate analog signal, comprising:
  - an amplifier operable to amplify an association between the first input analog signal and the first intermediate analog signal to produce a first output analog signal, and further operable to amplify an association between the second input analog signal and a second intermediate analog signal to produce a second output analog signal;
  - a first sampling network selectively coupled to the amplifier; and
  - a second sampling network selectively coupled to the amplifier.

6. The system of claim 5, wherein the amplifier comprises a non-differential amplifier having an inverting input terminal, a non-inverting input terminal, and a non-inverting output terminal.

7. The system of claim 5, wherein the amplifier comprises a differential amplifier having an inverting input terminal, a non-inverting input terminal, an inverting output terminal, and a non-inverting output terminal.

8. The system of claim 5, wherein:
- the first sampling network comprises a first select switch, a first feedback capacitor, and a first source capacitor, wherein the select switch is operable to couple the feedback capacitor and the source capacitor to the amplifier; and
- the second sampling network comprises a second select switch, a second feedback capacitor, and a second source capacitor, wherein the select switch is operable to couple the feedback capacitor and the source capacitor to the amplifier.

9. The system of claim 1, wherein the output analog signal associated with a particular subconverter stage comprises the corresponding input analog signal associated with the next subconverter stage.

10. An analog-to-digital conversion system comprising a plurality of cascaded subconverter stages wherein each subconverter stage comprises:
- an analog-to-digital converter operable to convert a first input analog signal into an intermediate digital signal;
- a digital-to-analog converter coupled to the analog-to-digital converter and operable to convert the intermediate digital signal into an intermediate analog signal; and
- an arithmetic unit coupled to the digital-to-analog converter and operable simultaneously to sample a second input analog signal and to produce an output analog signal representative of the difference between the first input analog signal and the corresponding intermediate analog signal, comprising:

wherein the output analog signal comprises a first output analog signal associated with the first input analog signal and a second output analog signal associated with the second input analog signal;

wherein the intermediate digital signal comprises a first intermediate digital signal associated with the first input analog signal and a second intermediate digital signal associated with the second input analog signal;

and wherein the intermediate analog signal comprises a first intermediate analog signal associated with the first input analog signal and a second intermediate analog signal associated with the second input analog signal.

11. A method for converting an analog signal into a digital signal, comprising the steps of:
(a) receiving a first input analog signal;
(b) converting the first input analog signal into an intermediate digital signal;
(c) converting the intermediate digital signal into an intermediate analog signal;
(d) generating an output analog signal at an arithmetic unit representative of the difference between the first input analog signal and the corresponding intermediate analog signal; and
(e) simultaneously with the step of generating, receiving a second input analog signal at the arithmetic unit.

12. The method of claim 11, further comprising the step of generating the first input analog signal and the second input analog signal from a single input analog signal prior to the step of receiving.

13. The method of claim 11, wherein the step of receiving further comprises the step of sampling the first input analog signal and the second input analog signal.

14. A method for converting an analog signal into a digital signal, comprising the steps of:
receiving a first input analog signal;
converting the first input analog signal into an intermediate digital signal;
converting the intermediate digital signal into an intermediate analog signal;
generating an output analog signal at an arithmetic unit representative of the difference between the first input analog signal and the corresponding intermediate analog signal; and
simultaneously with the step of generating, receiving a second input analog signal at the arithmetic unit;
wherein the step of generating an output analog signal comprises the steps of:
  sampling the first input analog signal at a first sampling network during a first phase of a clock signal;
  amplifying the difference between the second input analog signal and a second intermediate analog signal to produce a second output analog signal during the first phase of the clock signal;
  sampling the second input analog signal at a second sampling network during a second phase of a clock signal;
  amplifying the difference between the first input analog signal and the first intermediate analog signal to produce a first output analog signal during the second phase of the clock signal.

15. The method of claim 11, further comprising the step of repeating the steps (a) through (e) at a plurality of cascaded subconverter stages to produce a digital output signal, wherein each output analog signal associated with a particular subconverter stage is communicated as the corresponding input analog signal to the next subconverter stage.

16. An apparatus for performing arithmetic operations comprising:
- an amplifier operable to amplify an association between a first input analog signal and a first intermediate analog signal to produce a first output analog signal, and further operable to amplify an association between a second input analog signal and a second intermediate analog signal to produce a second output analog signal;
- a first sampling network selectively coupled to the amplifier; and
- a second sampling network selectively coupled to the amplifier.

17. The apparatus of claim 16, wherein:
- the amplifier comprises a non-differential amplifier having an inverting input terminal, a non-inverting input terminal, and a non-inverting output terminal; and
- the first sampling network and the second sampling network each comprises:
  - a feedback capacitor having a first terminal and a second terminal;
  - a source capacitor having a first terminal and a second terminal;
  - a select switch coupling the first terminal of the feedback capacitor and the first terminal of the source capacitor to the inverting input terminal of the amplifier;
  - a feedback switch coupling the second terminal of the feedback capacitor to the non-inverting output terminal of the amplifier;
  - a first input switch coupled to the second terminal of the feedback capacitor;
  - a second input switch coupled to the second terminal of the source capacitor;
  - a plurality of source switches coupled to the second terminal of the source capacitor; and
  - a common mode switch coupling a common mode voltage to the first terminal of the feedback capacitor and the first terminal of the source capacitor.

18. The apparatus of claim 17 wherein the select switch comprises a CMOS transistor implementation.

19. The apparatus of claim 17 wherein the select switch comprises an NMOS transistor.

20. The apparatus of claim 17 wherein the select switch comprises a PMOS transistor.

21. The apparatus of claim 17, wherein the plurality of source switches are operable to couple a selected one of a plurality of intermediate analog voltages to the second terminal of the source capacitor according to an intermediate digital signal.

22. The apparatus of claim 16, wherein:
- the amplifier comprises a differential amplifier having an inverting input terminal, a non-inverting input terminal, an inverting output terminal, and a non-inverting output terminal; and
- the first sampling network and the second sampling network each comprise:
  - a first feedback capacitor having a first terminal and a second terminal;
  - a first source capacitor having a first terminal and a second terminal;
  - a first select switch coupling the first terminal of the first feedback capacitor and the first terminal of the first source capacitor to the inverting input terminal of the differential amplifier;
  - a first feedback switch coupling the second terminal of the first feedback capacitor to the non-inverting output terminal of the differential amplifier;
  - a first input switch coupled to the second terminal of the first feedback capacitor;
  - a second input switch coupled to the second terminal of the first source capacitor;
  - a plurality of source switches coupled to the second terminal of the first source capacitor;
  - a first common mode switch coupling a common mode voltage to the first terminal of the first feedback capacitor and the first terminal of the first source capacitor;
  - a second feedback capacitor having a first terminal and a second terminal;
  - a second source capacitor having a first terminal and a second terminal;
  - a second select switch coupling the first terminal of the second feedback capacitor and the first terminal of the second source capacitor to the non-inverting input terminal of the differential amplifier;
  - a second feedback switch coupling the second terminal of the second feedback capacitor to the inverting output terminal of the differential amplifier;
  - a third input switch coupled to the second terminal of the second feedback capacitor;
  - a fourth input switch coupled to the second terminal of the second source capacitor;
  - a plurality of source switches coupled to the second terminal of the second source capacitor;
  - a second common mode switch coupling a common mode voltage to the first terminal of the second feedback capacitor and the first terminal of the second source capacitor; and
  - a center switch coupling the first terminal of the first source capacitor and the first terminal of the first feedback capacitor to the first terminal of the second source capacitor and the first terminal of the second feedback capacitor.

23. The apparatus of claim 22, wherein:
- the first common mode switch and the second common mode switch each comprises a PMOS transistor; and
- the center switch comprises an NMOS transistor.

24. The apparatus of claim 22, wherein the first select switch and the second select switch each comprises a CMOS transistor implementation.

25. The apparatus of claim 22, wherein the first select switch and the second select switch each comprises an NMOS transistor.

26. The apparatus of claim 22, wherein the first select switch and the second select switch each comprises a PMOS transistor.

27. The apparatus of claim 22, wherein the plurality of source switches are operable to couple a selected one of a plurality of intermediate analog voltages to the second terminals of the first and second source capacitors according to an intermediate digital signal.

28. An analog-to-digital conversion system comprising a plurality of cascaded subconverter stages wherein each subconverter stage comprises:
- an analog-to-digital converter operable to convert an input analog signal into an intermediate digital signal;
- a digital-to-analog converter coupled to the analog-to-digital converter and operable to convert the intermediate digital signal into an intermediate analog signal; and
- an arithmetic unit coupled to the digital-to-analog converter and operable to sample the input analog signal and to produce an output analog signal representative of the difference between a previous input analog signal sample and the intermediate analog signal corresponding to that previous input analog signal sample, both simultaneously with the analog-to-digital converter presenting the intermediate digital signal corresponding to the sampled input analog signal.

29. The system of claim 28, further comprising a sample and hold unit operable to sample the input analog signal and to communicate each sample to a first subconverter stage.

30. The system of claim 28, further comprising a digital correction unit coupled to the analog-to-digital converter of each subconverter stage and operable to generate a digital output using the intermediate digital signal from each subconverter stage.

31. The system of claim 28, further comprising a multiplexer for generating first and second input analog signals in alternate clock phases, from a single input analog signal.

32. The system of claim 28, wherein the output analog signal associated with a particular subconverter stage comprises the corresponding input analog signal associated with the next subconverter stage.

33. A method for converting an analog signal into a digital signal, comprising the steps of:

converting a sample of an input analog signal into an intermediate digital signal;

converting the intermediate digital signal into an intermediate analog signal; and in a same clock phase with the step of converting a sample of the input analog signal, generating a residual output analog signal representative of a difference between a previous sample of the input analog signal and its corresponding intermediate analog signal;

wherein the generating step and the step of converting a sample of the input analog signal are repeated in each of a plurality of successive clock phases.

34. The method of claim 33, further comprising:

periodically sampling a single input analog signal into a sequence of samples.

35. The method of claim 33, wherein successive samples correspond to samples of a first input analog signal and a second input analog signal.

36. The method of claim 33, further comprising the step of repeating the converting and generating steps at a plurality of cascaded subconverter stages to produce a digital output signal, wherein each output analog signal associated with a particular subconverter stage is communicated as the corresponding input analog signal to the next subconverter stage.

* * * * *